United States Patent [19]
Saida et al.

[11] Patent Number: 4,763,601
[45] Date of Patent: Aug. 16, 1988

[54] CONTINUOUS COMPOSITE COATING APPARATUS FOR COATING STRIP

[75] Inventors: Seishiro Saida; Isao Ito, both of Hikari; Satoshi Ito, Kawasaki; Naotake Okubo, Tokyo, all of Japan

[73] Assignee: Nippon Steel Corporation, Tokyo, Japan

[21] Appl. No.: 92,219

[22] Filed: Sep. 2, 1987

[51] Int. Cl.⁴ .................. C23C 14/56; C23C 16/54
[52] U.S. Cl. .................................. 118/718; 118/719; 118/723; 118/50.1; 204/298
[58] Field of Search ............... 118/718, 719, 723, 50.1; 204/298

[56] References Cited

U.S. PATENT DOCUMENTS

| 2,384,500 | 9/1945 | Stoll | 118/718 X |
| 3,868,106 | 2/1975 | Donckel et al. | 118/718 X |
| 4,519,339 | 5/1985 | Izu et al. | 118/718 |
| 4,664,951 | 5/1987 | Doehler | 118/719 X |
| 4,693,803 | 9/1987 | Casey et al. | 204/298 |

FOREIGN PATENT DOCUMENTS 57-195753 12/1982 Japan .
57-195754 12/1982 Japan .

Primary Examiner—Evan K. Lawrence
Attorney, Agent, or Firm—Spencer & Frank

[57] ABSTRACT

A continuous composite coating apparatus for coating a continuous strip has a pair of strip supply/take-up devices and at least two of a plasma chemical vapor deposition coating zone, an ion-plating coating zone and a sputtering coating zone which are arranged in series along the path of said strip between the strip supply/take-up devices. The adjacent coating zones are separated from each other by a partition wall having a slit which is sized to allow the strip to pass therethrough and guide rollers are provided adjacent to the upper edge of the strip so as to tense the strip such that the path of the strip is slightly convex downwards thereby to keep the strip away from the upper and lower edges of the slit. The coating zones are arranged to effect coating only on the underside of the strip which is not contacted by the guide rollers, whereby a coating layer having excellent properties without any defect can be formed on the underside of the strip.

14 Claims, 7 Drawing Sheets

CONTINUOUS COMPOSITE COATING APPARATUS FOR COATING STRIP

BACKGROUND OF THE INVENTION

The present invention relates to a continuous coating apparatus and, more particularly, to a continuous composite coating apparatus for continuously coating a strip of a base material such as a metal or a plastic with one, two or more coating layers.

Hitherto, various coating methods such as painting, plating, evaporation deposition and so forth have been used for the purpose of coating various materials in order to improve properties such as corrosion resistance as well as for the purpose of decoration.

In addition to these conventional methods, in recent years, dry coating methods such as ion plating, sputtering and plasma CVD (Chemical Vapor Deposition) have been known to be effective to produce coated strips having excellent corrosion resistance, decoration and wear resistance, and there is an increasing demand for products with value added produced by such coating methods.

In order to cope with such demands, Japanese Unexamined Patent Publication Nos. 195753/1982 and 195754/1982 propose continuous vacuum-type treating apparatus.

In these apparatus, different types of coating apparatus such as an ion plating apparatus, sputtering apparatus and plasma-type treating apparatus are arranged in series along a line so as to form successive treating zones and a flexible base member to be treated such as a film or a strip of a plastic is made to run through these treating zones so that coating layers of different properties are successively formed on the strip. The treating zones are sealed by suitable sealing means from the exterior and from the adjacent treating zones, so that the strip which runs through these treating zones are treated under different types of treating atmosphere. Typically, the sealing means is provided with upper and lower sealing rolls which are held in contact with the upper surface and the lower surface of the strip under treatment to form a seal between the regions upstream and downstream of these sealing rolls as viewed in the direction of running of the strip.

This known sealing arrangement, however, encounters a problem that the upper and/or the lower surface of the strip, which has just been coated or which is just going to be treated in a treating zone tends to be undesirably damaged due to direct contact with the sealing roll or rolls. Obviously, such a damage should be avoided from the view point of corrosion resistance and appearance of the final product.

SUMMARY OF THE INVENTION

Accordingly, an object of the present invention is to provide a continuous coating apparatus which is capable of producing, in a comparatively short time, a coiled strip with improved properties such as corrosion resistance, appearance, wear resistance and so forth, by continuously effecting at least a single treating process so as to form one, two or more coating layers, without causing any damage on the surface or surfaces of the strip before and after the treatment.

To this end, according to one aspect of the present invention, there is provided a continuous composite coating apparatus having a pair of strip supply/take-up devices and at least two of an ion plating coating zone, a sputtering coating zone and a plasma CVD coating zone arranged in series in the direction of run of a strip between the strip supply/take-up devices, the at least two of the coating zones being so arranged as to effect coatings only on the underside of the strip passing through these zones, comprising: partition wall means disposed between the adjacent coating zones and between each of the strip supply/take-up devices and the adjacent coating zone, each of the partition wall means having a partition wall provided with a slit adapted to allow the strip to pass therethrough and to maintain a desired vacuum level in each zone, the slit having upper and lower edges which are spaced apart from the adjacent surfaces of the strip so as not to interfere with the strip, the partition wall means further having a pair of guide rollers provided in the vicinity of the upper edge of the slit in each of the partition wall, the guide rollers of each pair being spaced from each other in the direction of run of the strip, the partition wall means being so arranged such that the strip is made to run in a tensed state from one to the other of the strip supply/take-up devices through the coating zones along a path which is slightly convex downwards due to contact between the guide rollers and the upper side of the strip.

The above and other objects, features and advantages of the present invention will become clear from the following description of preferred embodiments taken in conjunction with the accompanying drawings.

DESCRIPTION OF THE PREFERRED EMBODIMENTS

Figure 1:
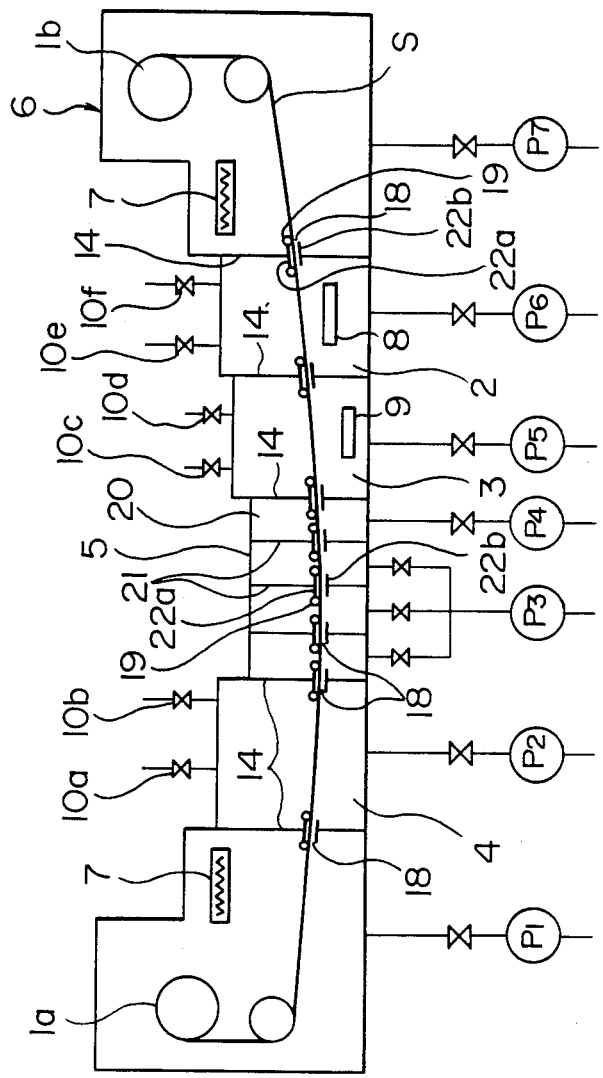
FIGS. 1 to 7 are schematic illustrations of first to seventh embodiments of the continuous composite coating apparatus in accordance with the present invention.

Referring first to FIG. 1, a first embodiment of the continuous composite coating apparatus of the present invention has a pair of strip supply/take-up devices $1a$ and $1b$ each being operative to supply and take-up a continuous strip S and a plurality of treating zones arranged in series along the path of the strip S between the strip supply/take-up devices $1a$ and $1b$. More specifically, these treating zones include an ion-plating zone 2, a sputtering zone 3 and a plasma CVD zone 4. A multi-staged slit pressure-differentialtype sealing zone 5 is defined between the sputtering zone 3 and the plasma CVD zone 4. These devices and zones $1a$, $2b$, 2, 3, 4 and 5 are arranged in a common vacuum vessel 6 and the respective treating zones are constructed such that coatings are effected only on the underside of the strip S. These zones 2, 3, 5 and 4 are separated by means of partition walls 14 each having a slit 18 which is so sized and designed to allow the strip S to pass therethrough and to maintain a desired vacuum level within each zone. A pair of guide rollers, which are spaced from each other in the direction of running of the strip S, are attached to the upper edge $22a$ of the slit 18. Small gaps are left between the upper and lower edges $22a$ and $22b$ of the slit 18 and the adjacent surfaces of the strip S.

Evacuating means $P_1$, $P_2$, $P_3$, $P_4$, $P_5$, $P_6$, and $P_7$ are connected to the vacuum vessel 6 so as to maintain desired levels of vacuum within the respective treating zones. Each of the strip supply/take-up devices $1a$ and $1b$ is capable of uncoiling and supplying the strip S in a tensed condition and also taking up and coiling the strip S. In consequence, the strip S runs from the right to the left and vice versa as viewed in FIG. 1. More specifically, the strip runs between the strip supply/take-up devices 1a and 1b in such a manner that the longitudinal mid portion of the strip within the treating apparatus is concave downwards due to contact with the guide rollers 19 associated with the upper edges 22a of the slits 18 in the partition walls 14 defining the respective zones.

The ion-plating zone 2 is provided with an evaporator 8. A reaction gas and a carrier gas are introduced through valves 10e and 10f, respectively, so as to form a predetermined atmosphere around the evaporator 8. In operation, the evaporator is heated and evaporated to generate ions which are deposited onto the underside of the strip S thereby forming a coating layer. The level of the vacuum maintained in the ion-plating zone is on the order of $10^{-4}$ to $10^{-3}$ Torr.

Ion plating is a deposition process which relies upon evaporation and subsequent ionization of atoms or molecules by reactive gas or non-reactive gas (carrier gas) so as to form coating deposit on substrates. Ion plating embraces all of the varieties of the modified excitation processes which utilize, for example, hollow cathode discharge gun, electron beam gun or resistance heating for the purpose of vaporization, and radio frequency electric field, direct current electric field or thermal emission electron radiation for the purpose of ionization.

The sputtering zone 3 has a target 9 and valves 10c and 10d through which an inert gas and a reaction gas are respectively introduced into this zone 3. In operation, the inert gas is ionized within an electric field and ions thus formed impinge upon the target 9 thereby sputtering atoms or molecules from the target 9, whereby the underside of the strip 9 is coated with the freed atoms or molecules. The level of the vacuum maintained on this zone 3 is on the order of $10^{-4}$ to $10^{-3}$ Torr.

Sputtering is a deposition process which utilizes a phenomena in which excited atoms or ions impact a target material to give a momentum so as to sputter atoms or ions out of the target material to be deposited onto substrates. Sputtering embraces all of the varieties of the above-mentioned method, such as one which utilizes radio frequency electric field, direct current electric field or magnetic field or a mixture of two of the these three fields for the purpose of atom excitation, or another one which utilizes ion beam to sputter target material.

If the ion-plating zone 2 and the sputtering zone 3 are supplied with reactive gases, these gases are ionized and the thus formed ions react with the components generated from the evaporator 8 and the target 9 so as to form reaction products with which the underside of the strip S is coated.

The plasma CVD zone 4 is provided with a valve 10a and a valve 10b for introducing a reactive gas and a carrier gas, respectively. In operation, the reactive gas is made to form a plasma under the influence of an electric field, thereby forming on the underside of the strip S a coating layer composed of products of a chemical reaction. The level of the vacuum maintained in this zone 4 is on the order of $10^{-1}$ Torr.

The order of arrangement of the ion-plating zone 2, sputtering zone 3 and the plasma CVD zone 4 shown in FIG. 1 is only illustrative and may be altered as desired insofar as these zones are arranged in series. It is, however, preferred that the ion-plating zone 2 and the sputtering zone 3 are disposed adjacent to each other. It is also possible to arrange such that, in view of the fact that the speed of formation of the coating layer by sputtering is generally small, a plurality of sputtering zones are arranged in series so as to enhance the treating speed of the whole apparatus.

A description will be made hereinunder as to the multi-staged slit pressure-differential-type sealing zone 5 disposed between the sputtering zone 3 and the plasma CVD zone 4. The sealing zone 5 has a plurality of partition walls 21 arranged in series in the direction of running of the strip S so as to define a plurality of vacuum chambers 20 disposed in series in the direction of running of the strip S. As in the case of the partition wall 14 defining the respective zones, each partition wall 21 is provided with a slit 18 having an upper edge 22a and a lower edge 22b and adapted to allow the strip S to pass therethrough. Each of the partition wall 21 is provided with a pair of guide rollers 19 which are spaced from each other in the direction of the running of the strip S and associated the upper edge 22a of the slit 18, so that one guide roller 19 is disposed on the upstream side while the other is on the downstream side of the associated partition wall 21. These rollers 19 are held in contact with the upper side of the strip S which is not coated. Suitable gaps are formed between the upper and lower edges 22a and 22b and the adjacent surfaces of the strip S so that the surfaces of the strip and coating layer or layers, if any, are prevented from being damaged due to contact with the upper and lower edges 22a and 22b. Suitable levels of vacuum are maintained in the vacuum chambers 20 by means of the evacuating means $P_3$ and $P_4$. A reference numeral 7 denotes a pre-heater for preheating the strip S.

Slits 18 similar to the slits in the partition walls 21 within the sealing zone 5 and sized to allow the strip S to pass therethrough without any contact with the edges of the slits are formed also in the partition walls 14 which are disposed between the supply/take-up device 1a and the plasma CVD zone 4, between the plasma CVD zone 4 and the sealing zone 5, between the sealing zone 5 and the sputtering zone 3, between the sputtering zone 3 and the ion-plating zone 2 and between the ion-plating zone 2 and the supply/take-up device 1b, so that the strip S with or without the coating layer is never damaged.

In the arrangement shown in FIG. 1, the multi-staged slit pressure-differential-type sealing zone 5 has four vacuum chambers 20. Amongest these vacuum chambers, three chambers 20 adjacent to the plasma CVD zone 4 are evacuated by a common evacuation means $P_3$ through different branches having valves, so that suitable levels of vacuum are established and maintained in these three vacuum chambers through a suitable control of these valves. This, however, is only illustrative and these three vacuum chambers 20 may be evacuated by independent vacuum means. It is also possible to evacuate the supply/take-up device 1a and the plasma CVD zone 4 by a common evacuation means.

The operation of the embodiment shown in FIG. 1 is as follows:

A coil of the strip S is mounted on either one of the supply/take-up devices 1a and 1b and the free end of the strip S uncoiled from the coil is set on the other of the supply/take-up devices through series of zones and the interior of the vacuum vessel 6 is evacuated. Subsequently, desired reaction gases and carrier gases are introduced into one or more of the ion-plating zone 2, sputtering zone 3 and the plasma CVD zone 4 depending on the types of the coating layer to be formed, while maintaining suitable levels of vacuum within the respective zones by means of the evacuation means $P_1$ to $P_7$. Then, the strip supply/take-up devices 1a and 1b are started to run the strip S through the series of zones while the strip S is suitably heated by the preheater 7 on the supply side and, as desired, by a heater or heaters which may be installed in the apparatus.

With the arrangement shown in FIG. 1, assuming here that the strip S is made to run from the right to the left as viewed in FIG. 1, and that the ion-plating zone 2 and the plasma CVD zone 4 are activated, a double-layered coating consisting of an ion-plated coating layer and a plasma CVD coating layer are successively formed on the strip S. It is also possible to form a tripple-layered coating consisting of a sputtered coating layer, a plasma CVD coating layer and an ion-plated coating layer. In such a case, the strip S first runs from the right to the left as viewed in FIG. 1 while the sputtering zone 3 and the plasma CVD zone 4 are activated with the ion-plating zone 2 kept not energized. Then, with the ion-plating zone 2 activated while the sputtering zone 3 and the plasma CVD 4 zone are stopped, the strip S is made to run from the left to the right. In consequence, a sputtered coating layer, a plasma CVD coating layer and an ion-plated coating layer are successively formed on the strip S.

It is thus possible to selectively form one or more of an ion-plated coating layer, a sputtered coating layer and a plasma CVD coating layer.

As explained before, during coating, the strip S is made to run between two supply/take-up devices 1a and 1b in such a manner as to be convex downwards while the strip S is contacted by the guide rollers 19 only at its upper side. In consequence, any vertical waving and lateral winding of the strip S can be suppressed so that the strip can be coated while it is held in a substantially flat condition. In consequence, a coating layer or layers of a high quality are obtained and, in addition, any risk for the coating layers to be damaged is avoided because the coating layer does not contact with the guide rollers.

Test operations with the first embodiment were conducted to obtain the following test results:

Test Operation 1

A double-layered coating consisting of a TiN layer and an amorphous $SiO_2$ ($\alpha$—$SiO_2$) layer was formed on one surface of a stainless steel strip in order to produce a stainless steel strip coil suitable for use as the material of automotive decorative trim having excellent corrosion resistance and attractive appearance.

In operation, a strip of SUS 430 stainless steel of 0.5 mm thick and 370 mm wide was made to run at a speed of 0.1 m/min through the apparatus. Meanwhile, the TiN coating layer was formed on the underside of the strip while it passes through the ion plating zone 2 in which Ti metal and $N_2$ were used as the evaporation source and the gas, respectively, and vacuum of $7 \times 10^{-4}$ Torr. was maintained. Then, the strip coated with the TiN layer was made to pass through the plasma CVD zone 4 in which a plasma of a mixture gas of $SiH_4$ and $N_2O$ was formed under vacuum of about 0.2 Torr., whereby an ($\alpha$—$SiO_2$) layer was formed on the TiN layer. The stainless steel strip thus coated and coiled exhibited a gold color suitable for use as an automotive decorative part as well as high corrosion resistance.

Test Operation 2

A double-layered coating consisting of a WC layer and an amorphous $SiO_2$ ($\alpha$—$SiO_2$) layer was formed on one surface of a stainless steel strip in order to produce a stainless steel strip coil suitable for use as the material of architectural interior mirror having excellent corrosion resistance and attractive appearance.

In operation, a strip of the same stainless steel as that used in Test Operation 1 was made to run through the apparatus at the same speed as in Test Operation. Meanwhile, the WC coating layer was formed on the underside of the strip while it passes through the sputtering zone 3 in which WC as the target and Ar gas were used and vacuum of $3 \times 10^{-3}$ Torr. was maintained. Then, the strip coated with the WC layer was made to pass through the plasma CVD zone 4 in which an ($\alpha$—$SiO_2$) layer was formed on the WC layer in the same manner as that in Test Operation 1. The stainless steel strip thus coated and coiled exhibited superior decorative nature, corrosion resistance and workability suitable for use as a material of architectural interior mirror.

FIGS. 2 to 5 respectively show second to fifth embodiments of the continuous composite coating apparatus in accordance with the present invention. In these Figures, the same reference numerals are used to denote the same parts or members as those appearing in FIG. 1 illustrating the first embodiment.

Figure 2:
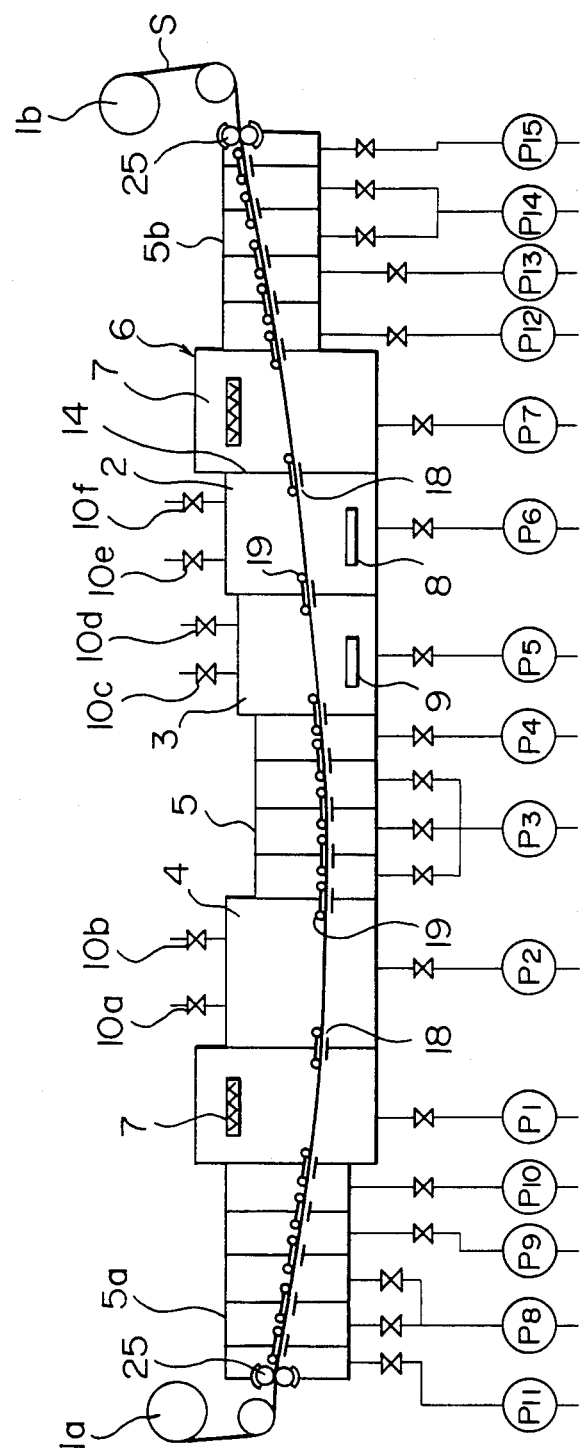

Referring to FIG. 2, in the second embodiment of the apparatus in accordance with the present invention, the supply/take-up devices 1a and 1b are disposed outside the vacuum vessel 6. Multi-staged slit pressure-differential type sealing zones 5a and 5b, which are similar to the sealing zone 5, are disposed between the supply/take-up device 1a and the vacuum vessel 6 and between the vacuum vessel 6 and the supply/take-up device 1b, respectively. Other portions are essentially the same as those of the first embodiment explained in connection with FIG. 1. Preferably, each of the sealing zones 5a and 5b is provided with a pair of seal rolls 25 made of an elastic material such as a rubber or a plastic and disposed adjacent to the slit in the partition wall on the atmosphere-side of the sealing zone, thereby to form an effective seal between the interior of the sealing zone and the atmosphere. Such elastic sealing rolls do not have substantial risk of damaging the surface of the strip S or any coating layer formed thereon.

Since the seal rolls 125 of such material are disposed in areas at a low level of vacuum, there is no substantial influence, on the vacuum level, by outgoing flux from the rolls 25. It is, however, preferred that the guide rollers 19 disposed in areas of a high level of vacuum are made of a metal such as a steel in order to prevent the occurrence of such outgassing due to a high level of vacuum. One of the multi-staged slit pressure-differential-type sealing devices 5a and 5b is evacuated through additional evacuating means $P_8$ to $P_{11}$, while the other is evacuated through evacuation means $P_{12}$ to $P_{15}$.

Figure 3:
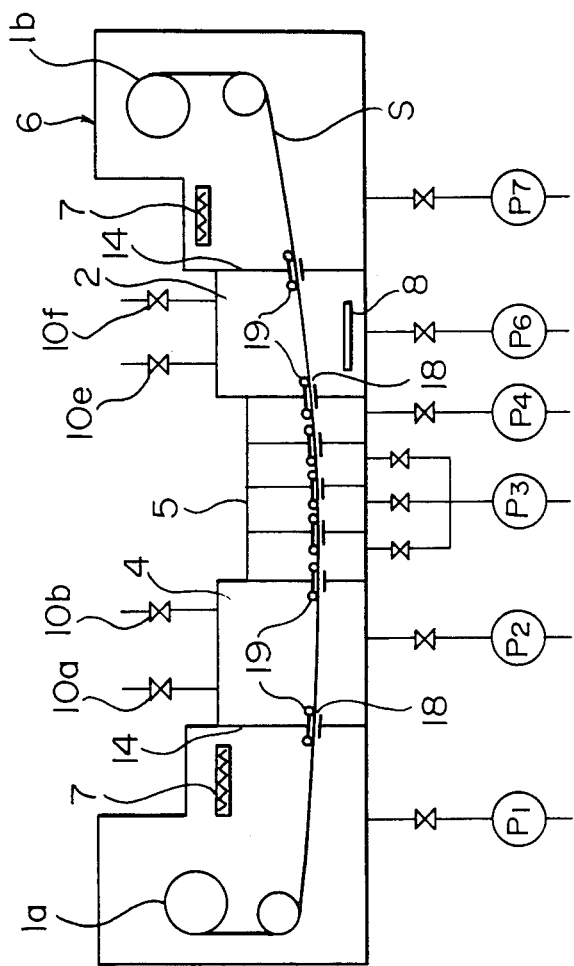

The third embodiment shown in FIG. 3 is devoid of the sputtering zone 3. Namely, the ion-plating zone 2 and the plasma CVD zone with the multi-staged slit pressure-differential-type sealing zone 5 interposed therebetween 4 are arranged in series between the supply/take-up devices 1a and 1b. These devices and zones 1a, 1b, 2, 4 and 5 are all disposed in a vacuum 6.

Figure 4:
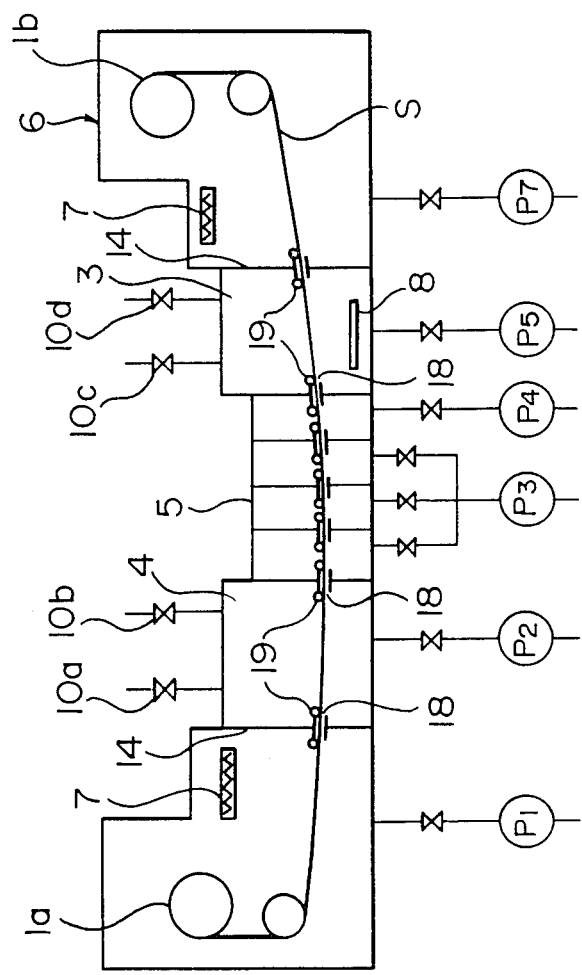

The fourth embodiment shown in FIG. 4 is devoid of the ion plating zone 2. Namely, the sputtering zone 3 and the plasma CVD zone with multi-staged slit pressure-differential-type sealing zone 5 interposed therebetween 4 are arranged in series between supply/take-up devices 1a and 1b. These devices and zones 1a, 1b, 3, 4 and 5 are all disposed in the vacuum vessel 6.

Figure 5:
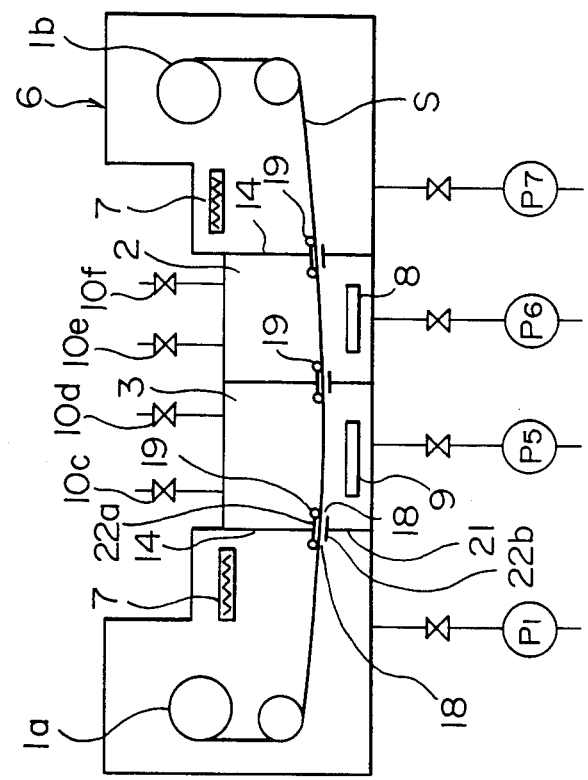

The fifth embodiment shown in FIG. 5 is devoid of the plasma CVD zone 4. Namely, the ion-plating zone 2 and the sputtering zone 3 are arranged in series between supply/take-up devices 1a and 1b. These devices and zones 1a, 1b, 2 and 3 are all disposed in the vacuum vessel 6.

Although the supply/take-up devices 1a and 1b are disposed inside the vacuum vessel 6 in the third to fifth embodiments, this is not exclusive and these embodiments may be modified such that the supply/take-up devices 1a and 1b are disposed outside the vacuum vessel 6 and the multi-staged slit pressure-differential type sealing zones are disposed between the respective supply/take-up devices 1a and 1b and the adjacent ends of the vacuum vessel 6, as described with reference to FIG. 2.

In the actual operation of the plant, it is often necessary to treat successive coils of the strip. In such a case, a subsequent coil is mounted on the supply/take-up device 1a or 1b on the supply side after the preceding coil has been exhausted, and the leading end of the strip uncoiled from the subsequent coil is connected to the trailing end of the preceding strip so as to be fed into the treating zones.

In the case where the supply/take-up devices 1a and 1b are disposed inside the vacuum vessel, a suitable shut-off means is placed between the supply/take-up device 1a or 1b on the supply side and the pre-heater 7 and then the vacuum around this supply/take-up device is released to make the latter accessible. Then, after mounting the new coil of the strip, vacuum is established again around the supply/take-up device and the shut-off means is dismissed, whereby the supply of the strip from the new coil can be commenced without requiring releasing and reestablishment of the vacuum in the respective zones of the apparatus. It will be understood that the second embodiment shown in FIG. 2 with the supply/take-up devices arranged outside the vacuum vessel 6 is advantageous in that it enables an easy mounting or replacement of the strip coil.

Figure 6:
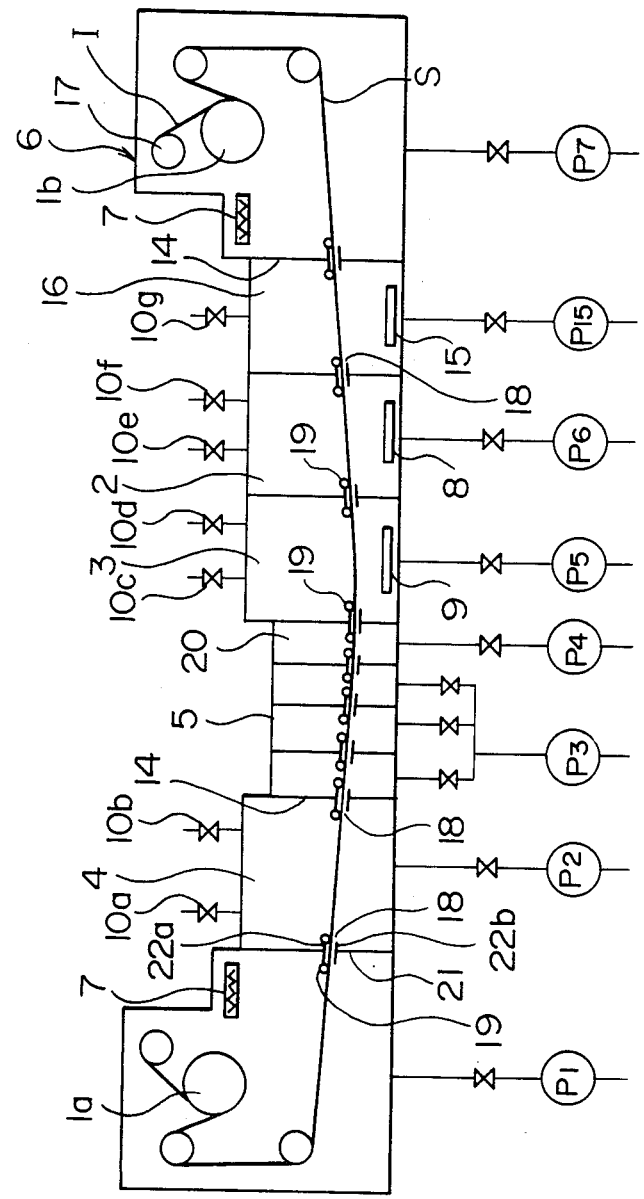

The sixth embodiment shown in FIG. 6 features an ion bombardment device 16 disposed downstream from the pre-heater 7 adjacent to one of the supply/take-up device 1b and having a valve 10g for introducing Ar gas. Between the ion bombardment device 16 and the other supply/take-up device 1a are disposed the ion-plating zone 2, sputtering zone 3, multi-staged slit pressure-differential-type sealing zone 5, plasma CVD zone 4 and the pre-heater 7 as in the case of the first embodiment. All these devices and zones are disposed in the vacuum vessel 6. In FIG. 6, numeral 17 denotes paper supply/take-up devices for supplying and taking up an intermediate paper sheet I. Such devices 17 may obviously be incorporated in the first to fifth and seventh embodiments. In FIG. 6, the same reference numerals are used to denote the same parts or members as those in FIG. 1. It is to be understood also that the sixth embodiment may be modified such that the supply/take-up devices 1a and 1b are disposed outside the vacuum vessel 6 and connected to the latter through respective multi-staged slit pressure-differential-type sealing zones similar to those used in the second embodiment explained before in connection with FIG. 2.

In operation of the sixth embodiment, the ion bombardment device 16 is adapted to form a plasma of Ar gas introduced through the valve 10g under the influence of an electric field so as to form ions which are made to collide with the surface of the strip S thereby effecting an ion bombardment treatment. This offers the following advantages: Namely, when the surface of the strip S to be coated is contaminated or covered with a film, the affinity between the strip surface and the coating layer to be formed thereon is impaired seriously. A higher affinity between the strip surface and the coating layer, therefore, is obtained by effecting an ion bombardment treatment on the strip surface and keeping the thus treated surface away from atmosphere and other gases until it is brought into contact with the coating atmosphere.

The operation of the sixth embodiment of the continuous composite coating apparatus of the present invention shown in FIG. 6 is as follows.

A coil of the strip S is mounted on either one of the supply/take-up devices 1a and 1b and the free end of the strip S uncoiled from the coil is set on the other of the supply/take-up devices through series of zones and the interior of the vacuum vessel 6 is evacuated. Subsequently, Ar gas is introduced into the ion bombardment device 16 and desired reaction gases and carrier gases are introduced into one or more of the ion-plating zone 2, sputtering zone 3 and the plasma CVD zone 4 depending on the types of the coating layers to be formed while maintaining suitable levels of vacuum within the respective zones by means of the evacuation means $P_1$ to $P_7$ and $P_{15}$. Then, the strip supply/take-up devices 1a and 1b are started to run the strip S through the ion bombardment device and the series of coating zones while the strip S is suitably heated by the pre-heater 7 on the supply side and, as desired, by a heater or heaters which may be installed in the apparatus, whereby coating layer or layers are formed on the strip S.

With the arrangement shown in FIG. 6, assuming here that only the ion-plating zone 2 and the plasma CVD zone 4 are activated, a double-layered coating consisting of an ion-plated coating layer and a plasma CVD coating layer are successively formed on the strip S. In this case, an improved affinity between the ion-plated layer and the strip S is attained by virtue of the ion bombardment treatment. It is also possible to form a tripple-layered coating consisting of a sputtered coating layer, a plasma CVD coating layer and an ion-plated coating layer. To this end, the strip S first runs from the right to the left as viewed in FIG. 6 while the ion bombardment device 16, sputtering zone 3 and the plasma CVD zone 4 are activated with the ion-plating zone 2 kept not energized, whereby a sputtered coating layer and a plasma CVD coating layer are formed successively. Then, the ion-plating zone 2 is activated while the sputtering zone 3 and the plasma CVD 4 zone are deenergized, and the strip S is made to run from the left to the right. In consequence, a sputtered coating layer, a plasma CVD coating layer and an ion-plated coating layer are successively formed on the strip S.

The sixth embodiment shown in FIG. 6 may be modified such that any one of the three coating zones is omitted, i.e., two amongst the ion-plating zone 2, the sputtering zone 3 and the plasma CVD zone 4 are provided so as to form one or two coating layers on the strip.

When it is desired to form a single coating layer on the strip, the ion bombardment device 16 and desired one of the ion-plating zone 2, the sputtering zone 3 and the plasma CVD zone 4 are activated and the strip S is made to run from the right to the left as viewed in FIG. 6 so that the desired coating layer is formed on the strip surface after an ion bombardment treatment.

Briefly, the ion bombardment treatment is a process in which a material such as a strip is placed in a vacuum vessel and a gas such as an Ar gas is introduced into the vacuum vessel while maintaining the vacuum in the latter on the order of $1 \times 10^{-5}$ to $1 \times 10^{-2}$ Torr. so as to generate plasma or Ar, the plasma being ionized under the influence of an electric field applied by means of electrodes, whereby the ions collide with the surface of the material. Preferably, the electric field applied is a high-frequency electric field, a biased A.C. electric field or a D.C. alternating type electric field. As a result of the ion bombardment treatment, the surface of the material gets rid of any contaminant and immobile film. The thus activated surface is directly dry-coated in vacuum without being subjected to any atmosphere under a reduced vacuum level. Examples of materials suitable for use as the dry-coating materials are metals such as Cr, Ti, Al, Mo, Ni and Cu and ceramics such as TiN, TiC, WC, $B_4C$ and $Al_2O_3$. The dry coating can be conducted to form one, two or more layers of these materials on the strip surface treated by ion bombardment.

The coating of the strip by the sixth embodiment exhibits superior affinity between the coating layer and the strip surface as well as high corrosion resistance and wear resistance because the strip surface treated by ion bombardment is devoid of any contaminant or immobile film and is activated before the dry coating operation is conducted. Furthermore, a high decorative effect is produced because the coating layer formed by dry coating exhibits a color peculiar to the metal or the ceramics used as the coating materials. These advantageous effects are obtainable with very small thickness of the coating layer or layers, say 1000 Å or so, so that any mechanical process such as bending conducted after the coating does not cause the coating layer to come off, thus ensuring high corrosion resistance, wear resistance and decorative effect of the strip even after such a mechanical work.

A test operation was conducted with the apparatus of the sixth embodiment to obtain the following results:

In the test operation, a double coating layer consisting of a TiL layer and an $SiO_2$ layer was formed by ion plating and plasma CVD method on a bright-annealed material of SUS 304 stainless steel. More specifically, a strip of the above-mentioned stainless steel and of 0.3 mm thick and 370 mm wide was made to run through the coating system at a speed of 0.4 m/min. The steel strip was made to pass first through the ion bombardment device 16 where a ion bombardment treatment was conducted at a frequency of 13.56 MHz and, then, through the ionplating zone 2 where an ion plating was effected under a vacuum of $1 \times 10^{-3}$ Torr, using Ti and $N_2$ as the evaporator and the gas, respectively, so that a TiN layer of 1000 Å thick was formed. Then, the strip was passed through the plasma CVD zone 4 in which a plasma CVD coating was carried out at a vacuum level of 0.2 Torr. under the supply of $SiH_4$ and $N_2O$ gases so as to form an $SiO_2$ layer of 1000 Å thick, whereby a double coating layer consisting of the TiN layer and the $SiO_2$ layer was formed on the strip.

The thus coated strip exhibited an attractive gold color suitable for use for decoration purposes. A promotion salt spray test and atmosphere exposure test conducted on the coated strip showed that the coated strip has a corrosion resistance is comparable to that of the SUS 316 stainless steel strip. The coated strip was then subjected to a bending test for the purpose of confirming the affinity between the coating layers and the strip. The strip was bent over 180° at a radius of curvature which was 2.5 times as large as the strip thickness but no separation of the coating layers was observed, thus providing a high affinity between the coating layer and the strip.

Figure 7:
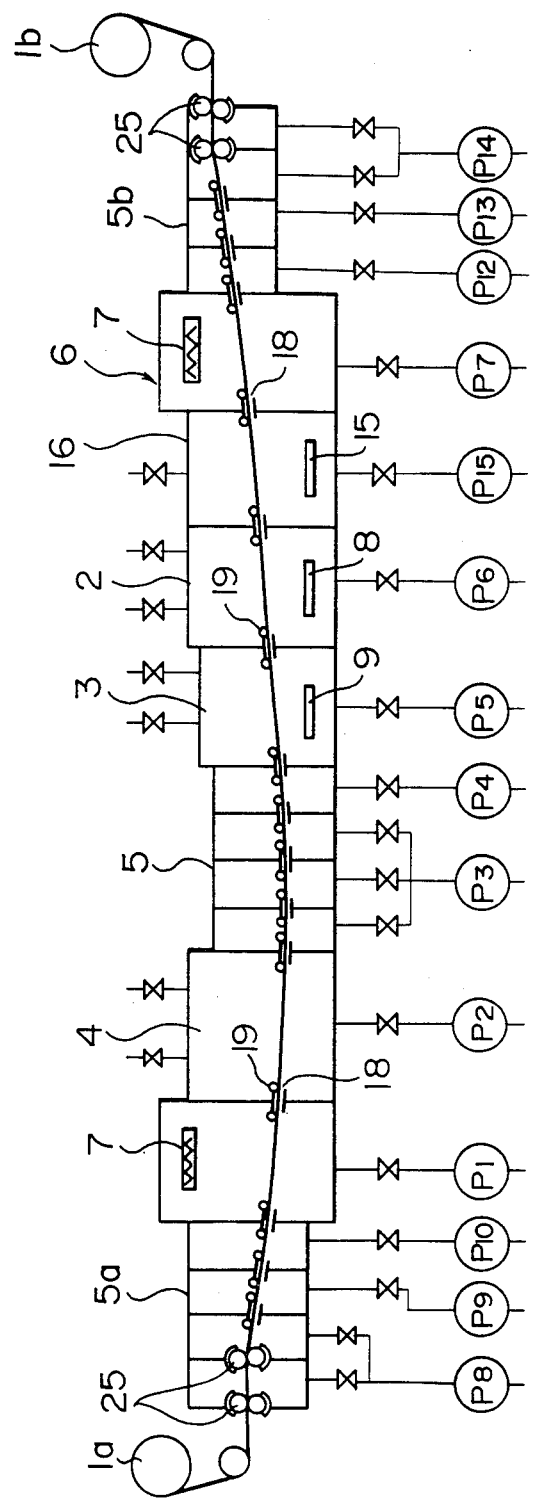

The seventh embodiment shown in FIG. 7 is similar to the sixth embodiment with the exception that the supply/take-up devices 1a and 1b are disposed outside the vacuum vessel 6 and connected to the latter through multi-staged slit pressure-differential-type sealing zones 5a as in the case of the embodiment described before in connection with FIG. 2.

It will be clear to those skilled in the art that the sixth and seventh embodiments may be modified such that each of these embodiments has two zones selected from the three coating zones, i.e., the ion plating zone 2, the sputtering zone 3 and the plasma CVD zone 4 as in the cases of the embodiments shown in FIGS. 3 to 5. In such modifications, the ion bombardment device 16 is disposed between one of the supply/take-up devices 1a and 1b and the ion-plating zone 2 or the sputtering zone 3.

What is claimed is:

1. A continuous composite coating apparatus having a pair of strip supply/take-up devices and at least two of an ion plating coating zone, a sputtering coating zone and a plasma CVD coating zone arranged in series in the direction of run of a strip between said strip supply/take-up devices,
    wherein said at least two of said coating zones are so arranged as to effect coating only on the underside of said strip passing through these zones; and
    a partition wall is disposed between adjacent coating zones and between each of said strip supply/take-up devices and an adjacent coating zone, the partition walls being provided with slits adapted to allow said strip to pass therethrough and to maintain a desired vacuum level in each zone, each slit having upper and lower edges which are spaced apart from the adjacent surfaces of said strip so as not to interfere with said strip, each partition wall further having a pair of guide rollers provided in the vicinity of said upper edge of said slit, the guide rollers of each pair being spaced from each other in the direction of run of said strip;
    the arrangement being such that said strip is made to run in a tensed state from one of said strip supply/take-up devices to the other through said coating zones along a path which is slightly convex downwards and said guide rollers contact only the upper side of said strip.

2. A continuous composite coating apparatus according to claim 1, wherein said pair of strip supply/take-up devices and said at least two of said three coating zones are disposed in a single vacuum vessel.

3. A continuous composite coating apparatus according to claim 1, wherein said at least two of said three coating zones are disposed in a single vacuum vessel, while said pair of strip supply/take-up devices are disposed outside said vacuum vessel and respectively connected to adjacent ends of said vacuum vessel through multi-staged slit pressure-differential-type sealing zones.

4. A continuous composite coating apparatus according to claim 1, further comprising an ion bombardment device disposed between one of said supply/take-up devices and one of said ion-plating coating zone and said sputtering coating zone.

5. A continuous composite coating apparatus according to claim 4, wherein said pair of strip supply/take-up devices, said ion bombardment device and said at least two of said three coating zones are disposed in a single vacuum vessel.

6. A continuous composite coating apparatus according to claim 4, wherein said ion bombardment device and said at least two of said three coating zones are disposed in a single vacuum vessel, while said pair of strip supply/take-up devices are disposed outside said vacuum vessel and respectively connected to adjacent ends of said vacuum vessel through multi-staged slit pressure-differential-type sealing zones.

7. A continuous composite coating apparatus according to claim 1, wherein said ion-plating coating zone, said sputtering coating zone and said plasma CVD coating zone are disposed in series between said pair of strip supply/take-up devices, said apparatus further comprising a multi-staged slit pressure-differential-type sealing zone disposed between said plasma CVD coating zone and said sputtering coating zone.

8. A continuous composite coating apparatus according to claim 1, wherein said ion-plating coating zone and said plasma CVD coating zone are arranged in series between said pair of strip supply/take-up devices, said apparatus further comprising a multi-staged slit pressure-differential-type sealing zone disposed between said ion-plating coating zone and said plasma CVD coating zone.

9. A continuous composite coating apparatus according to claim 1, wherein said sputtering coating zone and said plasma CVD coating zone are arranged in series between said pair of strip supply/take-up devices, said apparatus further comprising a multi-staged slit pressure-differential-type sealing zone disposed between said sputtering coating zone and said plasma CVD coating zone.

10. A continuous composite coating apparatus according to claim 3, wherein said multi-staged slit pressure-differential-type sealing zone includes a plurality of partition walls disposed in such a manner as to define a plurality of vacuum chambers arranged in series along the path of said strip, each partition wall having a slit sized to allow said strip to pass therethrough, said sealing zone further including a pair of guide rollers disposed in the vicinity of upper edge of said slit in each of said partition walls and spaced apart from each other in the direction of run of said strip such that one of said guide rollers is on the upstream side while the other is on the downstream side of the associated partition wall, said guide rollers being adapted to contact the upper side of said strip so as to tense said strip thereby to keep said strip out of contact with the upper and lower edges of said slit.

11. A continuous composite coating apparatus according to claim 6, wherein said multi-staged slit pressure-differential-type sealing zone includes a plurality of partition walls disposed in such a manner as to define a plurality of vacuum chambers arranged in series along the path of said strip, each partition wall having a slit sized to allow said strip to pass therethrough, said sealing zone further including a pair of guide rollers disposed in the vicinity of upper edge of said slit in each of said partition walls and spaced apart from each other in the direction of run of said strip such that one of said guide rollers is on the upstream side while the other is on the downstream side of the associated partition wall, said guide rollers being adapted to contact the upper side of said strip so as to tense said strip thereby to keep said strip out of contact with the upper and lower edges of said slit.

12. A continuous composite coating apparatus according to claim 7, wherein said multi-staged slit pressure-differential-type sealing zone includes a plurality of partition walls disposed in such a manner as to define a plurality of vacuum chambers arranged in series along the path of said strip, each partition wall having a slit sized to allow said strip to pass therethrough, said sealing zone further including a pair of guide rollers disposed in the vicinity of upper edge of said slit in each of said partition walls and spaced apart from each other in the direction of run of said strip such that one of said guide rollers is on the upstream side while the other is on the downstream side of the associated partition wall, said guide rollers being adapted to contact the upper side of said strip so as to tense said strip thereby to keep said strip out of contact with the upper and lower edges of said slit.

13. A continuous composite coating apparatus according to claim 8, wherein said multi-staged slit pressure-differential-type sealing zone includes a plurality of partition walls disposed in such a manner as to define a plurality of vacuum chambers arranged in series along the path of said strip, each partition wall having a slit sized to allow said strip to pass therethrough, said sealing zone further including a pair of guide rollers disposed in the vicinity of upper edge of said slit in each of said partition walls and spaced apart from each other in the direction of run of said strip such that one of said guide rollers is on the upstream side while the other is on the downstream side of the associated partition wall, said guide rollers being adapted to contact the upper side of said strip so as to tense said strip thereby to keep said strip out of contact with the upper and lower edges of said slit.

14. A continuous composite coating apparatus according to claim 9, wherein said multi-staged slit pressure-differential-type sealing zone includes a plurality of partition walls disposed in such a manner as to define a plurality of vacuum chambers arranged in series along the path of said strip, each partition wall having a slit sized to allow said strip to pass therethrough, said sealing zone further including a pair of guide rollers disposed in the vicinity of upper edge of said slit in each of said partition walls and spaced apart from each other in the direction of run of said strip such that one of said guide rollers is on the upstream side while the other is on the downstream side of the associated partition wall, said guide rollers being adapted to contact the upper side of said strip so as to tense said strip thereby to keep said strip out of contact with the upper and lower edges of said slit.

* * * * *